(12) United States Patent
Zheng

(10) Patent No.: US 10,615,543 B2
(45) Date of Patent: Apr. 7, 2020

(54) GROUNDING STRUCTURE FOR POWER SOCKET

(71) Applicant: YUEQING HONGCHANG RADIO CO., LTD., Yueqing, Zhejiang Province (CN)

(72) Inventor: Xiao-Ming Zheng, Yueqing (CN)

(73) Assignee: YueQing Hongchang Radio Co., Ltd., YueQing (CN)

( * ) Notice: Subject to any disclaimer, the term of this patent is extended or adjusted under 35 U.S.C. 154(b) by 0 days.

(21) Appl. No.: 16/255,829

(22) Filed: Jan. 24, 2019

(65) Prior Publication Data

US 2019/0245307 A1    Aug. 8, 2019

(51) Int. Cl.
| | |
|---|---|
| *H01R 4/66* | (2006.01) |
| *H01R 13/648* | (2006.01) |
| *H05K 1/02* | (2006.01) |
| *H05K 1/18* | (2006.01) |
| *H01R 13/50* | (2006.01) |

(Continued)

(52) U.S. Cl.
CPC ........... *H01R 13/648* (2013.01); *H01R 13/50* (2013.01); *H01R 13/655* (2013.01); *H01R 24/76* (2013.01); *H01R 24/78* (2013.01); *H05K 1/0215* (2013.01); *H05K 1/184* (2013.01); *H01R 12/58* (2013.01); *H01R 12/707* (2013.01); *H01R 2103/00* (2013.01); *H05K 2201/1028* (2013.01);
(Continued)

(58) Field of Classification Search
CPC .... H01R 12/58; H01R 12/707; H01R 13/648; H01R 13/50; H01R 13/655; H01R 24/76; H01R 24/78; H01R 2103/00; H05K 1/0215; H05K 1/184; H05K 2201/10189; H05K 2201/1028; H05K 2201/10325; H05K 2201/10916
USPC ............................................ 439/92–108, 682
See application file for complete search history.

(56) References Cited

U.S. PATENT DOCUMENTS 4,836,793 A * 6/1989 Munroe ............... H01R 13/655
                                                              439/106
5,924,877 A * 7/1999 Byrne ...................... H01R 4/64
                                                              361/727
(Continued)

FOREIGN PATENT DOCUMENTS

| CN | 201323305 Y | 10/2009 |
|---|---|---|
| CN | 108718011 A | 10/2018 |

OTHER PUBLICATIONS

Great Britain Intellectual Property Office, Combined Search and Examination Report for Application No. GB1901502.3, dated Jun. 20, 2019, three pages.

*Primary Examiner* — Khiem M Nguyen
(74) *Attorney, Agent, or Firm* — Thomas J. Nikolai; DeWitt LLP

(57) ABSTRACT

A grounding structure for power socket includes a grounding main body, which consists of a basic section, a first connecting section, a second connecting section, a grounding section and a contact section. The first and the second connecting section are separately downward extended from two opposite ends of the basic section, such that the basic section and the first and second connecting sections together define a receiving space in between them. The contact section is downward extended from a side edge of the basic section into the receiving space; and the first connecting section is outward bent at its lower end to form the ground- (Continued)

ing section. And, the grounding section is provided at an outer end with a grounding opening.

12 Claims, 8 Drawing Sheets

(51) Int. Cl.
    *H01R 24/76*     (2011.01)
    *H01R 13/655*     (2006.01)
    *H01R 24/78*     (2011.01)
    H01R 103/00     (2006.01)
    H01R 12/70     (2011.01)
    H01R 12/58     (2011.01)

(52) U.S. Cl.
    CPC .............. *H05K 2201/10189* (2013.01); *H05K 2201/10325* (2013.01); *H05K 2201/10916* (2013.01)

(56) References Cited

U.S. PATENT DOCUMENTS

| | | | |
|---|---|---|---|
| 7,670,169 B1 * | 3/2010 | Pai | H01R 13/655 |
| | | | 439/465 |
| 9,543,667 B2 * | 1/2017 | Kamor | H01R 4/305 |
| 2005/0112919 A1 | 5/2005 | Lee | |
| 2013/0164957 A1 | 6/2013 | Ku et al. | |
| 2017/0141513 A1 * | 5/2017 | Hashiguchi | H01R 12/716 |

* cited by examiner

GROUNDING STRUCTURE FOR POWER SOCKET

This application claims the priority benefit of China patent application number 201820222541.2 filed on Feb. 8, 2018.

FIELD OF THE INVENTION

The present invention relates to a grounding structure for power socket, and more particularly, to a grounding structure for conveniently mounting onto a power socket to withstand an instantaneous big short circuit current.

BACKGROUND OF THE INVENTION

An electronic apparatus, such as an ATX (Advanced Technology eXtended) power supply, a display screen or a television set, has a power socket provided thereon. The power socket usually includes three first terminals, which are located at a front side of the power socket for a female connector on a power cord to plug in, and three second terminals, which are located at a rear side of the power socket. A first and a second one of the first terminals are a positive power terminal and a negative power terminal, respectively, and electrically connected to a first and a second one of the second terminals; and a third one of the first terminals is a ground terminal and electrically connected to a third one of the second terminals. In the case of an ATX power supply, the three second terminals of the power socket are inserted into and soldered to a circuit board of the ATX power supply, so that each of the second terminals has a solder ball formed thereon. Via the solder balls, the first and the second one of the second terminal are separately electrically connected to two power layers on the circuit board and the third one of the second terminals is electrically connected to a grounding layer of the circuit board.

To meet the IEC 62368-1 standard, the currently available ATX power supply usually adopts one of two ways to ensure its safe grounding. The first way is to use a green yellow grounding wire that meets AWG standards. The green yellow grounding wire has an end soldered to the third one of the second terminals of the power socket of the ATX power supply and another end screw-locked to a metal chassis of an electronic apparatus. In the event a failure or a short circuit occurs in the ATX power supply, an instantaneous big current or short-circuit current resulting from the short circuit will be guided by the third one of the second terminals (i.e. the ground terminal) from the grounding layer of the circuit board to the green yellow grounding wire, from where the instantaneous big current is discharged to the metal chassis to achieve the effect of electric shock prevention and safe use of the ATX power supply. The second way is to use a circuit board that has large unused areas clad with copper (i.e. a copper grounding foil), so that the ground terminal is electrically connected to the copper grounding foil to withstand an increased instantaneous big current. In this case, the copper-clad circuit board must be subjected to a 1500 A grounding test to meet the required IEC standards.

While the above two ways all provide the required grounding effect, they have some disadvantages. The green yellow grounding wire has a fixed length that is not always suitable for using with all kinds of electronic apparatuses. Besides, electronic apparatuses from different manufacturers are not always the same in terms of the position at where the grounding wire is connected to a contact on the circuit board, which might result in an uneasily found disconnection or separation of the grounding wire in the electronic apparatuses and accordingly, cause an electric shock and an increased cost. On the other hand, the copper-clad circuit board is subjected to the risk of a fully melted grounding solder ball on the circuit board when the instantaneous big current flows through the copper grounding foil, which tends to cause a failed grounding due to the one-time occurrence of an instantaneous big current. Therefore, the copper-clad circuit board is not safe for use and the large-area copper grounding foil thereof disadvantageously prevents it from being manufactured at a reduced cost.

SUMMARY OF THE INVENTION

A primary object of the present invention is to provide a grounding structure for power socket. The grounding structure includes an integrally-formed large-area grounding main body, which can withstand an instantaneous big short circuit current.

Another object of the present invention is to provide a grounding structure for power socket, which can be conveniently mounted onto a power socket to achieve good grounding effect at a reduced cost.

To achieve the above and other objects, the grounding structure for power socket provided according to the present invention includes a grounding main body consisting of a basic section, a first connecting section, a second connecting section, a grounding section and a contact section. The first and the second connecting section are separately downward extended from two opposite ends of the basic section, such that the basic section and the first and second connecting sections together define a receiving space in between them. The contact section is downward extended from a side edge of the basic section into the receiving space; and the first connecting section is outward bent at its lower end to form the grounding section. And, the grounding section is provided at an outer end with a grounding opening. With the integrally-formed large-area grounding main body, the grounding structure according to the present invention can withstand an instantaneous big current, and can be conveniently mounted onto the power socket to achieve good grounding effect at a reduced cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
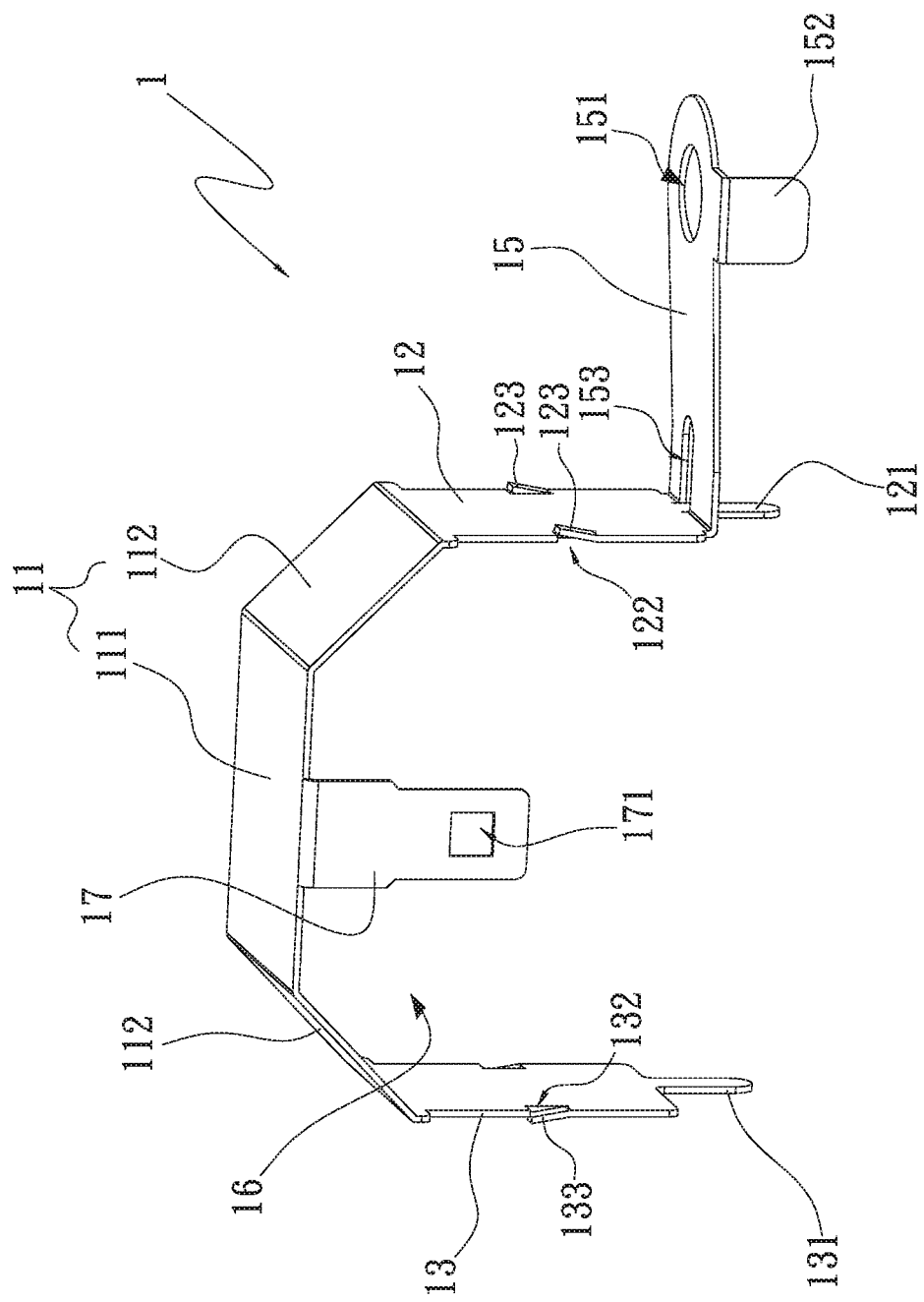
FIG. 1 is a perspective view of a grounding structure for power socket according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
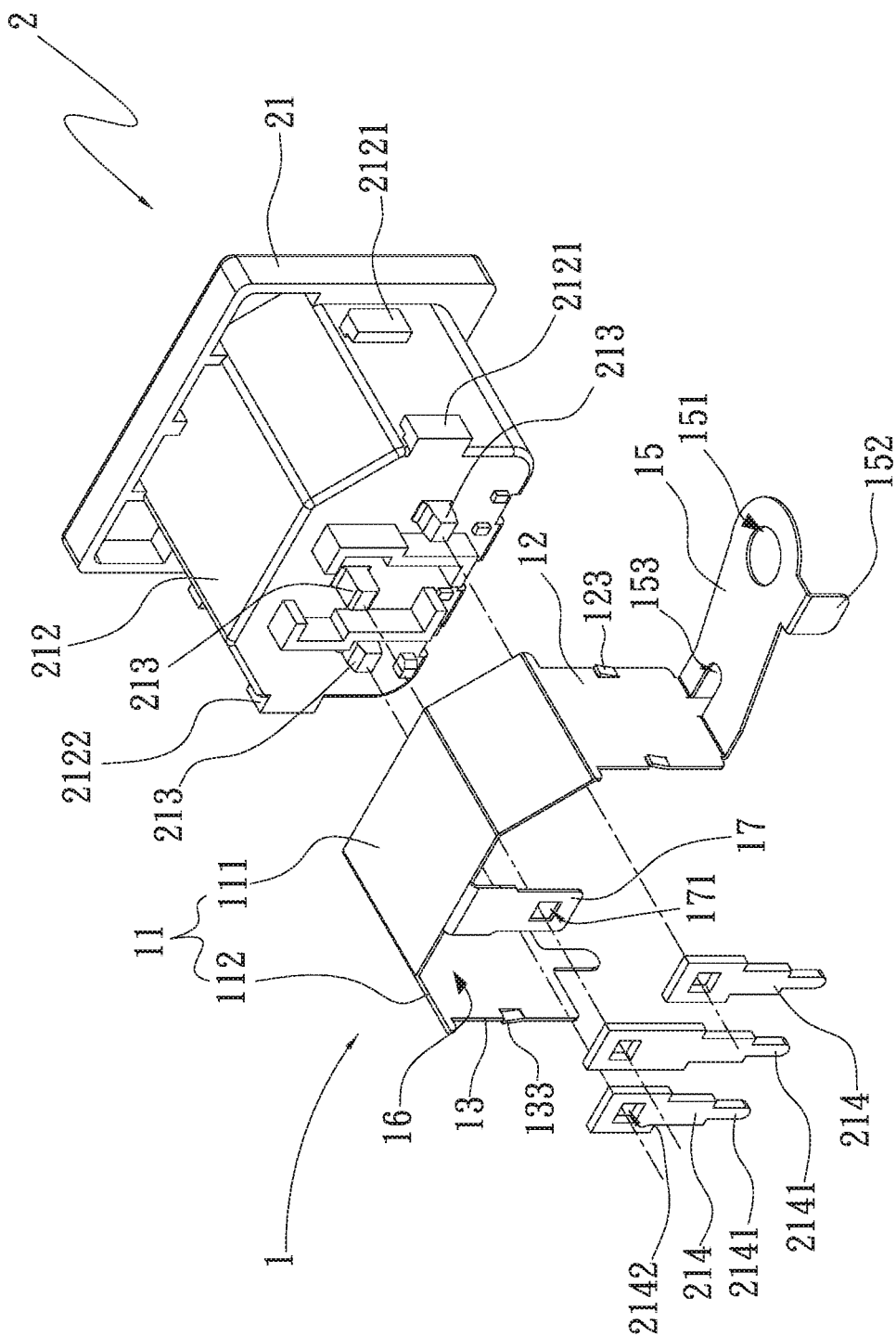
FIG. 2 is an exploded perspective view showing the grounding structure according to the first embodiment of the present invention before it is mounted onto a power socket.
Figure 3:
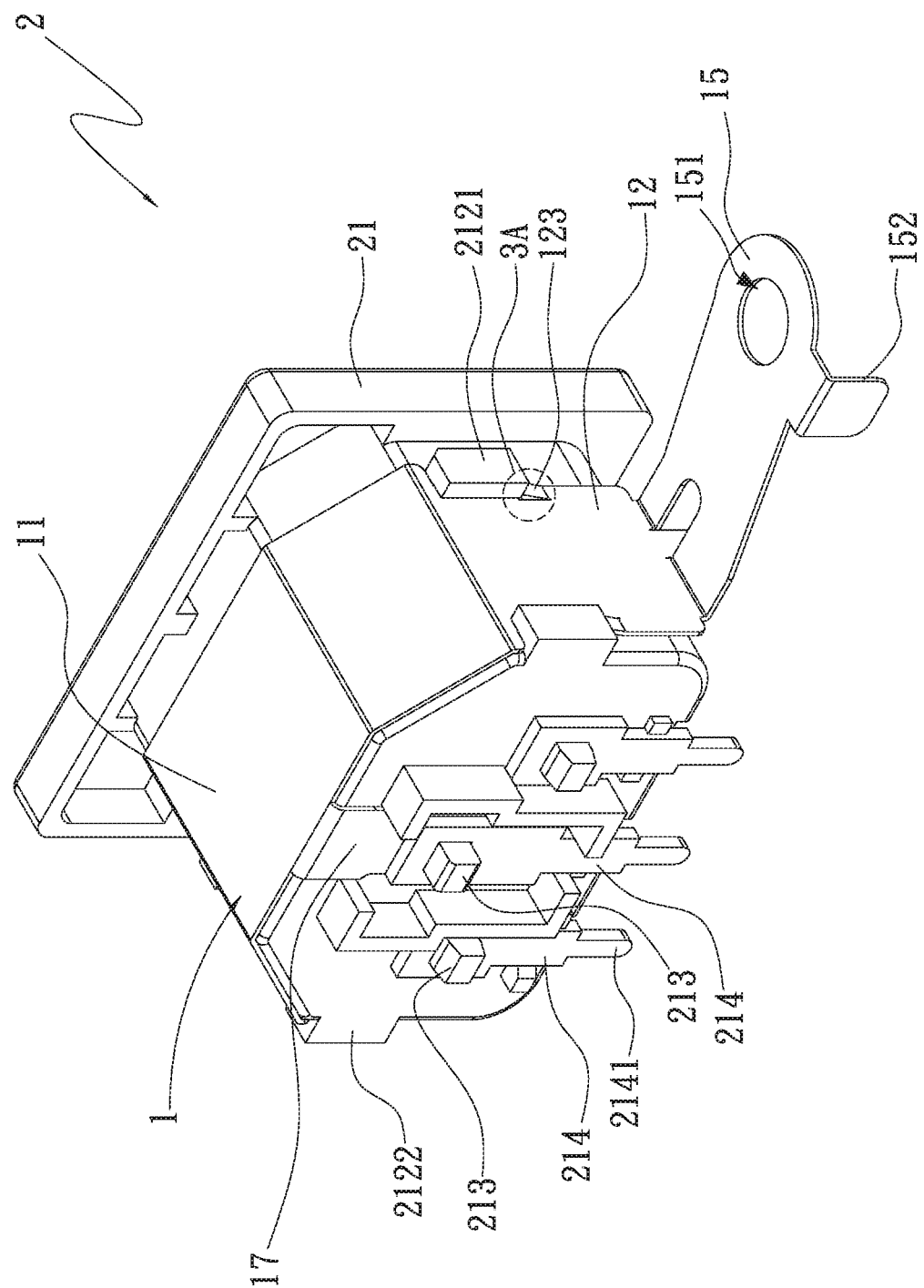
FIG. 3 is an assembled view of FIG. 2, viewed from a rear side of the power socket.

Please refer to FIG. 1, which is an assembled perspective view of a grounding structure for power socket according to a first embodiment of the present invention. For the purpose of conciseness and clarity, the present invention is also briefly referred to as the grounding structure herein. As shown, the grounding structure of the present invention includes a grounding main body 1 configured for mounting onto a power socket 2, as shown in FIGS. 2 and 3. A power socket is commonly seen on an electronic apparatus, which can be, for example, an ATX power supply, a display screen, a notebook computer or a projector (not shown). In the first embodiment of the present invention, the power socket 2 is non-restrictively illustrated as a power socket provided on an ATX power supply. The grounding main body 1 of the grounding structure is in the form of a bent strip made of a metal material and includes a basic section 11, a first connecting section 12, a second connecting section 13, and a grounding section 15. The first and the second connecting section 12, 13 are separately downward extended from two opposite ends of the basic section 11, such that the basic section 11 and the first and second connecting sections 12, 13 together define a receiving space 16 in between them. The basic section 11 includes a middle horizontal portion 111 and two inclined portions 112 outward and downward extended from two opposite ends of the horizontal portion 111 to correspondingly connect to the first and the second connecting section 12, 13 at their respective proximal or upper end. The grounding main body 1 further includes a contact section 17, which is downward extended from a side edge of the horizontal portion 111 of the basic section 11 into the receiving space 16. The contact section 17 is provided at a distal or lower end with an opening 171 that extends through the contact section 17 in a thickness direction thereof.

Figure 5A:
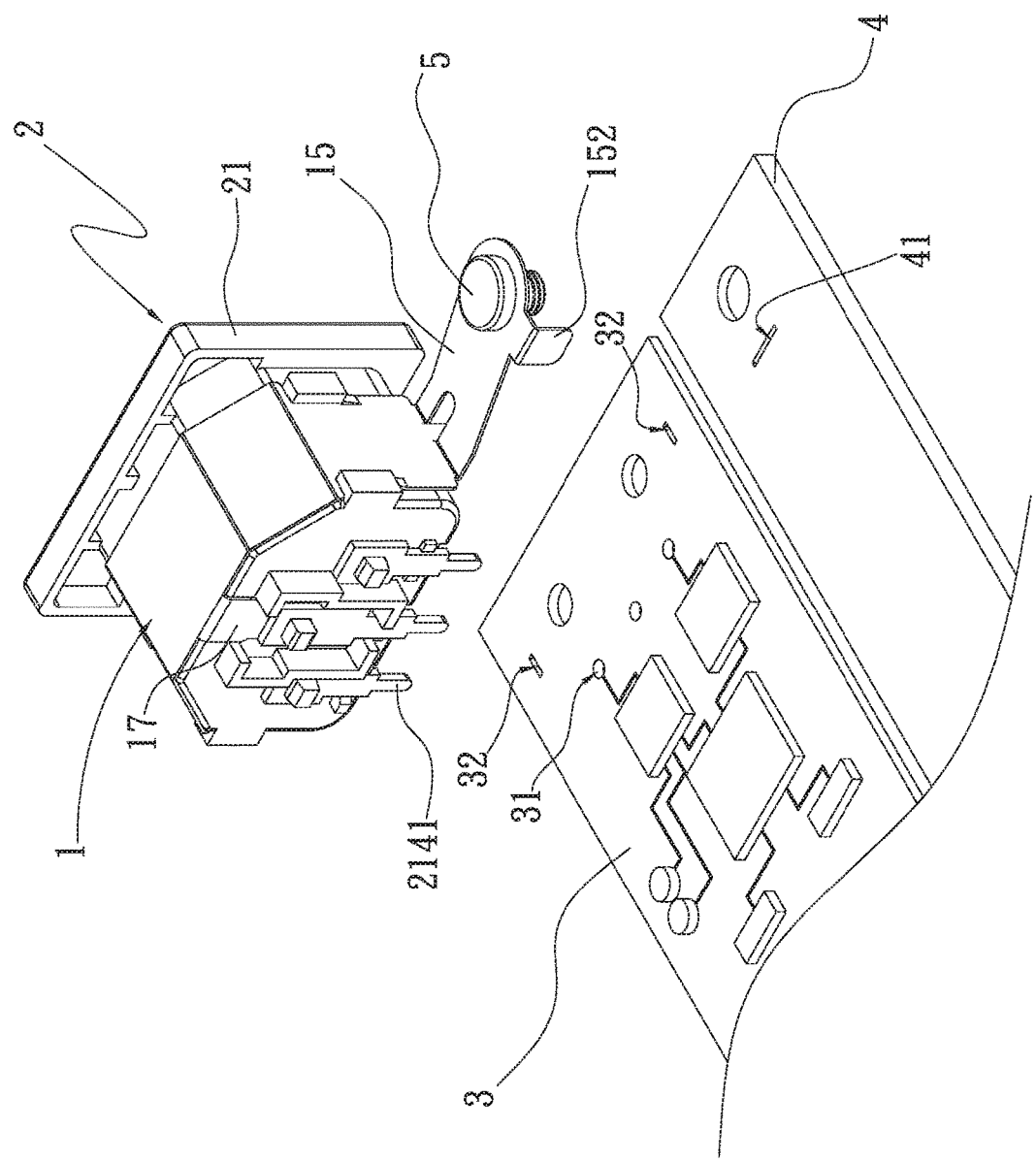
FIG. 5A is an exploded perspective view showing the assembled power socket and grounding structure of the present invention before connecting to a circuit board in an electronic apparatus.
Figure 5B:
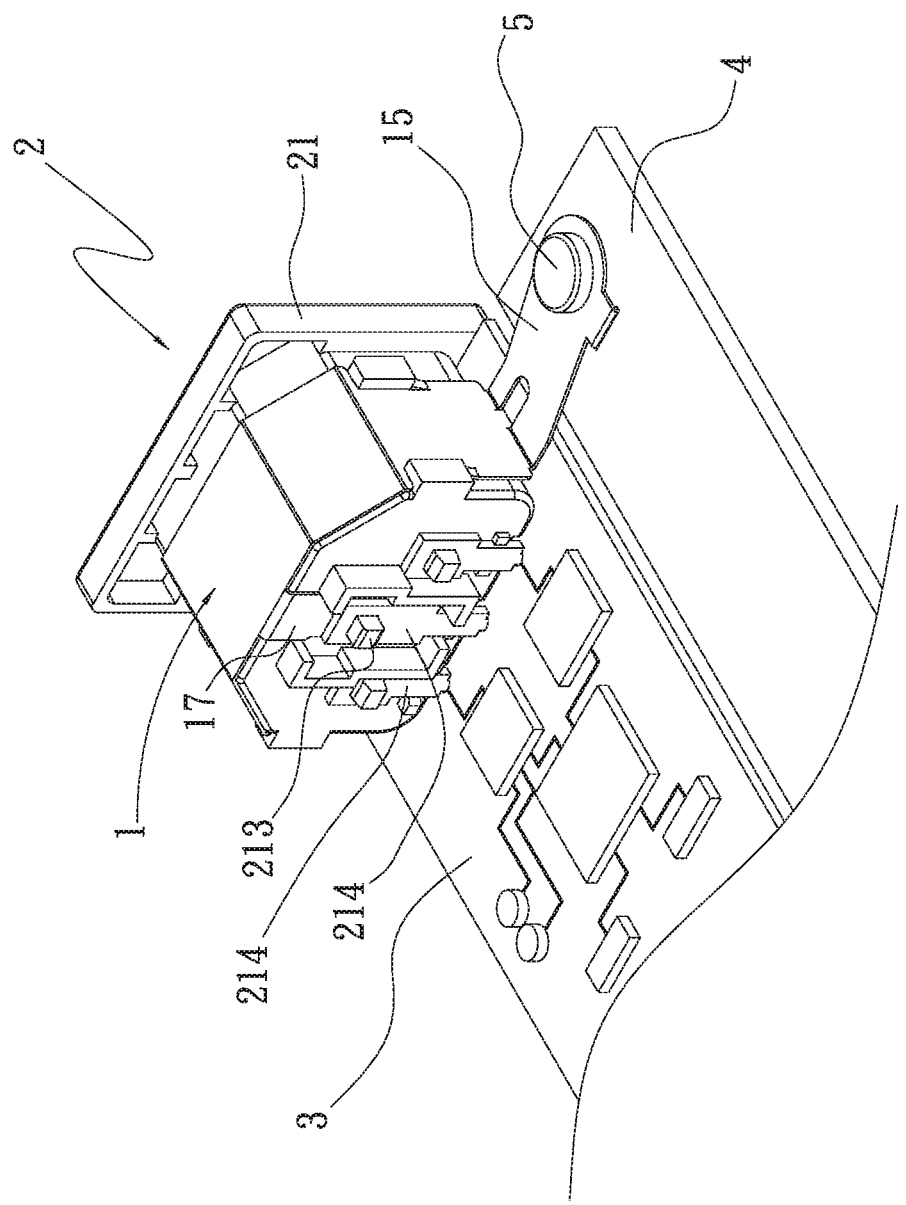
FIG. 5B is an assembled view of FIG. 5A.

The first connecting section 12 is outward bent at its distal or lower end to form the grounding section 15. In the first embodiment, the grounding section 15 is extended horizontally from the lower end of the first connecting section 12 and is therefore substantially perpendicular to the first connecting section 12. The grounding section 15 is provided at its distal or outer end with a grounding opening 151, through which a fastening element 5 such as a metal-made screw is extended, as can be seen in FIGS. 5A and 5B. The grounding section 15 is connected at its proximal or inner end to the distal or lower end of the first connecting section 12, and is further provided near its distal end with a locating tab 152, which is downward extended from a side edge of the grounding section 15 at a position adjacent to the grounding opening 151. The grounding section 15 is configured to engage with a corresponding metal-made carrier 4, as can be seen in FIGS. 5A and 5B. The carrier 4 can be, for example, a metal chassis of the electronic apparatus, as illustrated in the first embodiment of the present invention. By extending the fastening element 5 through the grounding opening 151 into the chassis of the electronic apparatus, the grounding section 15 is directly fixed and electrically connected to the chassis in a very convenient manner and the chassis is grounded. In the first embodiment of the present invention, the basic section 11, the first and second connecting sections 12, 13, the contact section 17 and the grounding section 15 are integrally formed with one another to constitute the grounding main body 1 of the grounding structure.

The first and the second connecting section 12, 13 include a first lug 121 and a second lug 131, respectively. As can be seen in FIG. 1, the grounding section 15 is processed at a joint between it and the first connecting section 12 to form an elongated slot 153, such that the material from the slot 153 is downward bent at the joint to form the first lug 121. The second lug 131 is downward extended from a distal or lower end of the second connecting section 13 and is located corresponding and parallel to the first lug 121. The first and the second connecting section 12, 13 are formed on each of their two opposite side edges with a first and a second make-way slot 122, 132, respectively. At a lower end of each of the first make-way slots 122, there is a first stop member 123 integrally formed with the first connecting section 12, such that a free upper end of the first stop member 123 is elastically movable in the first make-way slot 122. Similarly, at a lower end of each of the second make-way slots 132, there is a second stop member 133 integrally formed with the second connecting section 13, such that a free upper end of the second stop member 133 is elastically movable in the second make-way slot 132. In the illustrated first embodiment, the first and the second connecting section 12, 13 are correspondingly provided with two first make-way slots 122 having two first stop members 123 and two second make-way slots 132 having two second stop members 133, respectively. However, in practical implementation of the present invention, the number of the first and second make-way slots 122, 132 and of the first and second stop members 123, 133 are not limited to two, but can be otherwise three or more.

Figure 4:
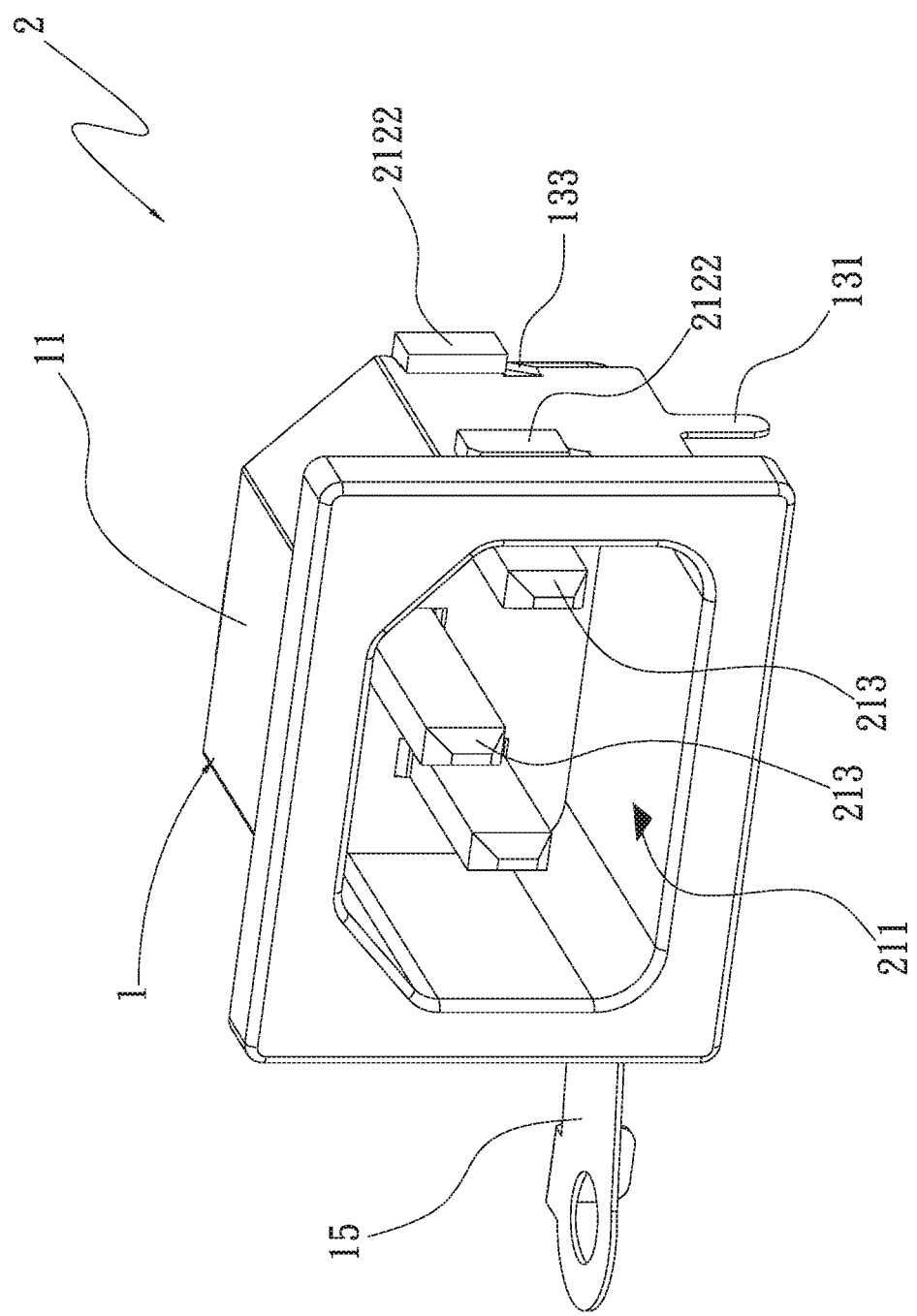
FIG. 4 is another assembled perspective view showing the assembled grounding structure and power socket, viewed from a front side of the power socket.

Please refer to FIGS. 2, 4, 5A and 5B, wherein FIG. 4 is an assembled perspective view showing the assembled grounding structure and power socket 2, viewed from a front side of the power socket 2; and FIGS. 5A and 5B are exploded and assembled perspective views, respectively, showing the assembled power socket 2 and grounding structure of the present invention before and after connecting to a circuit board 3 in the electronic apparatus. As shown, the power socket 2 includes a socket main body 21 and a plurality of second conducting terminals 214. The socket main body 21 is made of an electrical insulation material, and includes an inner insertion space 211, a forward-opened outer shell 212 internally defining the insertion space 211, and a plurality of first conducting terminals 213. The grounding structure of the present invention is mounted onto a top and two lateral outer surfaces of the shell 212 of the socket main body 21. The first conducting terminals 213 are located in the insertion space 211, while the second conducting terminals 214 are disposed on a rear outer surface the shell 212. In the drawings of the present invention, the first and the second conducting terminals 213, 214 are three in number. A first and a second one of the three second conducting terminals 214 (i.e. the two lateral ones in the drawings) are a positive power terminal and a negative power terminal, respectively, while a third one (i.e. the middle one) is a ground terminal. The first conducting terminals 213 respectively have a rear end that is rearward extended from the insertion space 211 through the socket main body 21 to project beyond the rear outer surface of the shell 212, so that the second conducting terminals 214 are respectively electrically connected at an upper end to the rear ends of the first conducting terminals 213. That is, the first and the second ones of the first conducting terminals 213 are electrically connected to a first and a second one of the second conducting terminals 214 located at two lateral sides thereof, and the third one of the first conducting terminals 213 is electrically connected to a third one of the second conducting terminals 214 located at a middle position thereof.

Figure 3A:
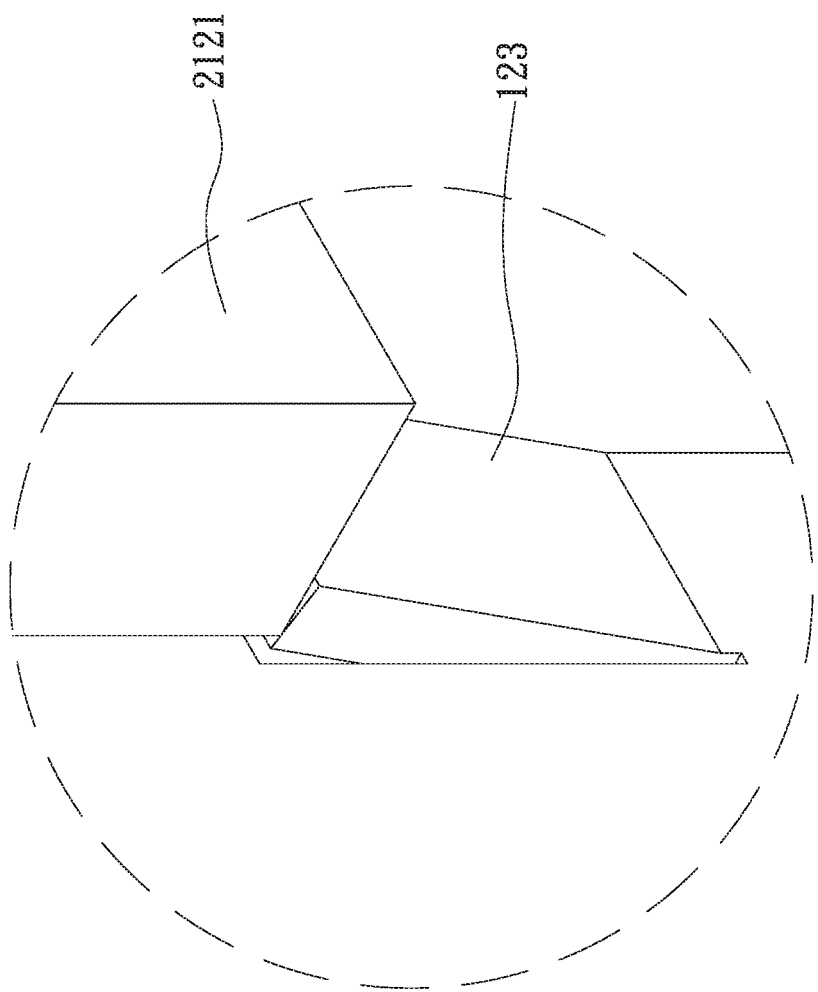
FIG. 3A is an enlarged view of the circled area of FIG. 3.

As can be seen in FIGS. 2 and 3, the shell 212 is provided on one of its two lateral outer surfaces, which is the right lateral outer surface in the drawings, with two axially spaced first slide channels 2121. And, as can be seen in FIG. 4, the shell 212 is further provided on another lateral outer surface, i.e. the left one in the drawings, with two axially spaced second slide channels 2122 corresponding to the two first slide channels 2121. When the grounding main body 1 is fitted onto the socket main body 21 to receive the outer shell 212 in the receiving space 16 defined in the grounding main body 1, the two opposite side edges of the first connecting section 12 of the grounding main body 1 are correspondingly slid through the two first slide channels 2121, and the two opposite side edges of the second connecting section 13 of the grounding main body 1 are correspondingly slid through the two second slide channels 2122. At this point, the first stop members 123 on the first connecting section 12 are compressed by the first slide channels 2121, bringing the free upper ends of the first stop members 123 to elastically move into the corresponding first make-way slots 122. Meanwhile, the second stop members 133 on the second connecting section 13 are compressed by the second slide channels 2122, bringing the free upper ends of the second stop members 133 to elastically move into the corresponding second make-way slots 132. When the first and the second stop members 123, 133 have downward past through the first and the second slide channels 2121, 2122, respectively, the free upper ends of the first and the second stop members 123, 133 automatically spring out of the first and the second make-way slots 122, 132 back to their original outward projected positions to abut on lower ends of the first and the second slide channels 2121, 2122, as can be most clearly seen in FIGS. 3, 3A and 4. At this point, inner surfaces of the horizontal portion 111 and the two opposite inclined portions 112 of the basic section of the grounding main body 1 and of the first and second connecting sections 12, 13 are in tight contact with the top and lateral outer surfaces of the shell 212 of the socket main body 21, bringing the grounding main body 1 to externally firmly connect to the socket main body 21. It is noted the grounding main body 1 has a total inner surface area equal to or larger than a total outer area of the shell 212.

Each of the second conducting terminals 214 includes a lower end that is downward extended to form a contact projection 2141, and an upper end provided with a connecting opening 2142 that is extended through a thickness direction of the second conducting terminal 214 and configured for correspondingly engaging with the rear ends of the first conducting terminals 213 that are rearward projected beyond the shell 212. More specifically, in the illustrated first embodiment, the connecting openings 2142 on the first and second ones of the second conducting terminals 214 are correspondingly engaged with the rear ends of the first and second ones of the first conducting terminals 213, while the connecting opening 2142 on the third one of the second conducting terminals 214 together with the opening 171 on the contact section 17 are correspondingly engaged with the rear end of the third one (i.e. the ground terminal) of the first conducting terminals 213, such that the contact section 17 is electrically connected to the third one of the first conducting terminals 213 and the third one of the second conducting terminals 214 at the same time.

As shown in FIGS. 5A and 5B, the lower ends of the second conducting terminals 214 are configured for inserting into a circuit board 3 in the electronic apparatus. More specifically, the contact projections 2141 of the second conducting terminals 214 are inserted into and further soldered to a plurality of insertion holes 31 correspondingly provided on the circuit board 3, so that the lower end of the third one of the second conducting terminals 214, which is located at a rear middle position of the shell 212, is electrically connected to a grounding layer of the circuit board 3 and the lower ends of the first and second ones of the second conducting terminals 214, which are located at two lateral sides of the middle second conducting terminal 214, are separately electrically connected to two power layers of the circuit board 3, i.e. one positive and one negative power layer. Meanwhile, the first and second lugs 121, 131 downward extended from the first and second connecting sections 12, 13 of the grounding main body 1 are separately engaged with a plurality of engaging slits 32 correspondingly provided on the circuit board 3, and the locating tab 152 downward extended from the grounding section 15 of the grounding main body 1 is engaged with a locating slit 41 correspondingly provided on the carrier 4. With the first and second lugs 121, 131 and the locating tab 152, the grounding main body 1 can be firmly connected to the circuit board 3 and the carrier 4.

When a failure or a short circuit occurs in the ATX power supply, an instantaneous big current (i.e. a short-circuit current) resulting from the short circuit will be directly guided by the grounding layer (not shown) of the circuit board 3 to the middle second conducting terminal 214, and accordingly, the contact section 17 of the grounding main body 1. The instantaneous big current or short-circuit current received by the contact section 17 sequentially flows through the large-area basic section 11 and the first and second connecting sections 12, 13 to the grounding section 15, from where the instantaneous big current is completely discharged to the carrier 4, i.e. the chassis of the electronic apparatus, to effectively achieve the purpose of electric shock prevention and safe use of the ATX power supply.

Since the grounding main body 1 according to the present invention is an integrally formed large-area member, it can withstand a big current, such as an instantaneous big current or a short-circuit current. According to the present invention, the grounding main body 1 is configured to withstand an instantaneous big current ranged below 1500 A, which meets the IEC 62368-1 standard.

According to the present invention, the grounding structure has a structural design that is not only suitable for conveniently mounting onto a power socket 2 and connecting to a circuit board 3 and a carrier 4 at an effectively reduced cost, but also has the effect of withstanding a big current. The grounding structure of the present invention can be applied to power sockets 2 used on different electronic apparatus and allows a user to clearly know the position at where the ground section 15 of the grounding main body 1 is locked to the electronic apparatus. Therefore, it is able to conveniently check the firm locking of the grounding section 15 to the chassis of the electronic apparatus to effectively protect users against any possible electric shock.

Figure 6:
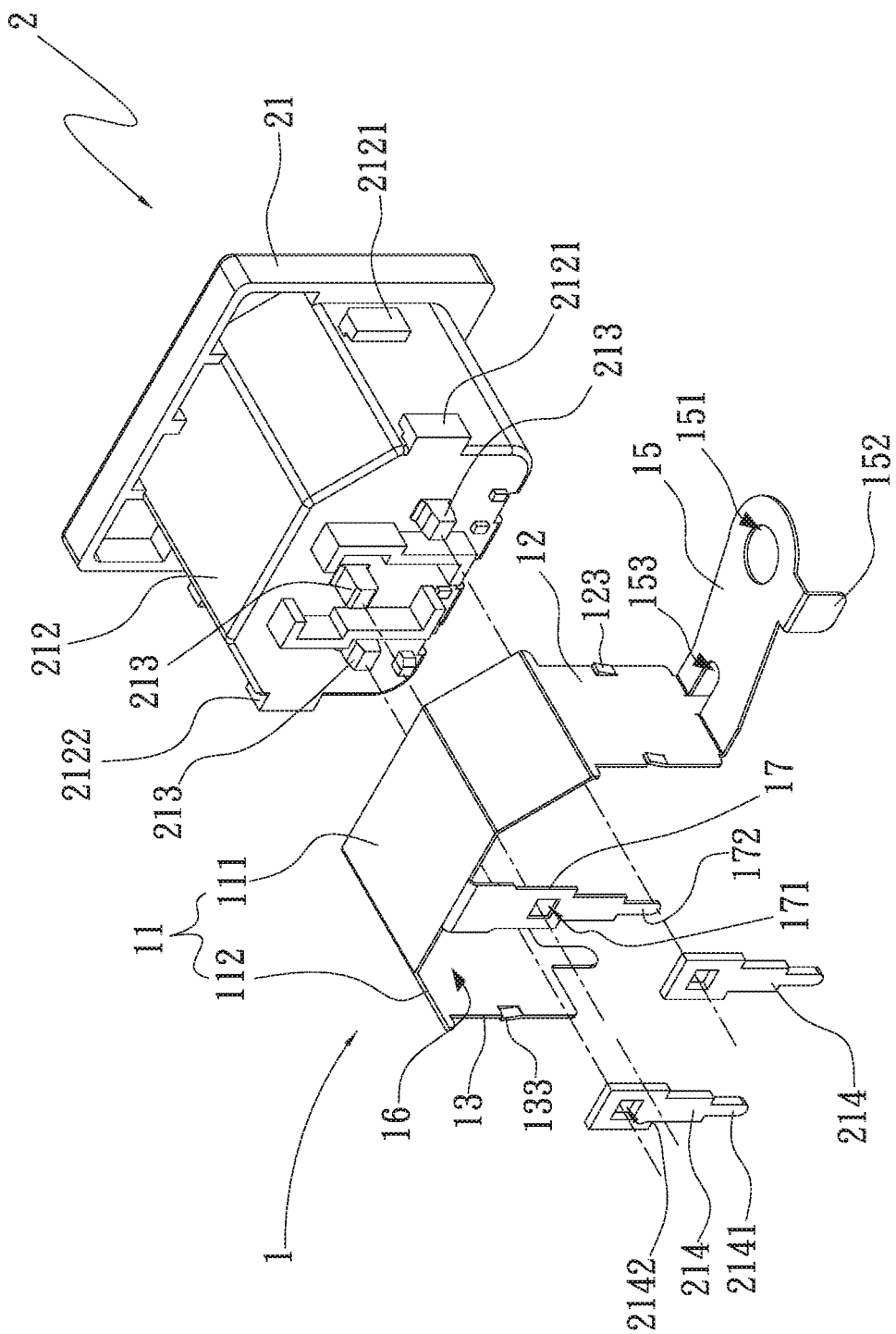
FIG. 6 is an exploded perspective view showing the grounding structure according to a second embodiment of the present invention before it is mounted onto a power socket.

Please refer to FIG. 6, which is an exploded perspective view showing the grounding structure according to a second embodiment of the present invention before it is mounted onto a power socket 2. The grounding structure in the second embodiment is different from the first one mainly in that the grounding main body 1 thereof includes a contact section 17 having a lower end downward extended to provide a grounding projection 172 while the third one of the second conducting terminals 214 is omitted from the power socket 2. The grounding projection 172 of the contact section 17 is inserted into an insertion hole 31 correspondingly provided on the circuit board 3 to electrically connect to the grounding layer of the circuit board 3.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A grounding structure for power socket, comprising a grounding main body; the grounding main body including a basic section, a first connecting section, a second connecting section, a grounding section, and a contact section; the first and the second connecting section being separately downward extended from two opposite ends of the basic section, such that the basic section and the first and second connecting sections together define a receiving space in between them; the contact section being downward extended from a side edge of the basic section into the receiving space; the first connecting section being outward bent at its lower end to form the grounding section; and the grounding section being provided at an outer end with a grounding opening.

2. The grounding structure for power socket as claimed in claim 1, wherein the basic section includes a middle horizontal portion and two inclined portions outward and downward extended from two opposite ends of the horizontal portion to correspondingly connect to upper ends of the first and second connecting sections; and the contact section being downward extended from a side edge of the horizontal portion of the basic section.

3. The grounding structure for power socket as claimed in claim 2, wherein the contact section is provided at a lower end with an opening that extends through the contact section in a thickness direction thereof.

4. The grounding structure for power socket as claimed in claim 3, wherein the contact section is downward extended from the lower end to provide a grounding section.

5. The grounding structure for power socket as claimed in claim 4, wherein the first and the second connecting section include a first lug and a second lug, respectively; the grounding section being processed at a joint between it and the first connecting section to form an elongated slot, such that material from the slot is downward bent to form the first lug; and the second lug being downward extended from a lower end of the second connecting section and being located corresponding and parallel to the first lug.

6. The grounding structure for power socket as claimed in claim 5, wherein the grounding section is connected at an inner end to the lower end of the first connecting section and is further provided near the outer end with a locating tab, which is downward extended from a side edge of the grounding section at a position adjacent to the grounding opening.

7. The grounding structure for power socket as claimed in claim 3, wherein the first and the second connecting section are formed on each of their two opposite side edges with a first and a second make-way slot, respectively; at a lower end of each of the first make-way slots, there being a first stop member integrally formed with the first connecting section, such that a free upper end of the first stop member is elastically movable in the first make-way slot; and similarly, at a lower end of each of the second make-way slots, there being a second stop member integrally formed with the second connecting section, such that a free upper end of the second stop member is elastically movable in the second make-way slot.

8. The grounding structure for power socket as claimed in claim 3, wherein the grounding main body is made of a metal material; and the basic section, the first and second connecting sections, and the grounding section are integrally formed to constitute the grounding main body.

9. The grounding structure for power socket as claimed in claim 3, wherein the grounding section is configured to engage with a corresponding metal-made carrier; and the grounding section being fixedly and electrically connected to the carrier via a fastening element that is extended through the grounding opening provided on the outer end of the grounding section into the carrier.

10. The grounding structure for power socket as claimed in claim 1, wherein the grounding structure is configured for mounting onto a power socket; the power socket including:
a socket main body, onto which the grounding main body is mounted, including an inner insertion space, a forward-opened outer shell that internally defines the insertion space, and a plurality of first conducting terminals; the shell being received in the receiving space defined in the grounding main body; the first conducting terminals being located in the insertion space in the shell and respectively having a rear end rearward extended from the insertion space through the socket main body to project beyond a rear outer surface of the shell; and the contact section of the grounding main body being electrically connected to the rear end of one of the first conducting terminals; and
a plurality of second conducting terminals being disposed on the rear outer surface of the shell; and upper ends of the second conducting terminals being correspondingly electrically connected to the rear ends of the first conducting terminals.

11. The grounding structure for power socket as claimed in claim 10, wherein the first and the second connecting section of the grounding main body are formed on each of their two opposite side edges with a first and a second make-way slot, respectively; at a lower end of each of the first make-way slots, there being a first stop member integrally formed with the first connecting section, such that a free upper end of the first stop member is elastically movable in the first make-way slot; and similarly, at a lower end of each of the second make-way slots, there being a second stop member integrally formed with the second connecting section, such that a free upper end of the second stop member is elastically movable in the second make-way slot.

12. The grounding structure for power socket as claimed in claim 11, wherein the shell of the socket main body is provided on one of its two lateral outer surfaces with two axially spaced first slide channels and on the other lateral outer surface with two axially spaced second slide channels corresponding to the two first slide channels; and the two opposite side edges of the first connecting section of the grounding main body being correspondingly slid through the two first slide channels and the two opposite side edges of the second connecting section of the grounding main body being correspondingly slid through the two second slide channels when the grounding main body is fitted onto the shell of the socket main body, such that the free upper ends of the first and second stop members abut on lower ends of the first and second slide channels, respectively.

* * * * *